United States Patent
Scherer et al.

(10) Patent No.: US 6,797,649 B2
(45) Date of Patent: Sep. 28, 2004

(54) METHOD FOR DEPOSITING A FLUORINE-DOPED SILICA FILM

(75) Inventors: Karin Scherer, St. Maur (FR); Pascale Lacan, Paris (FR); Richard Bosmans, Noiseau (FR)

(73) Assignee: Essilor International Compagnie Generale d'Optique, Charenton cedex (FR)

( * ) Notice: Subject to any disclaimer, the term of this patent is extended or adjusted under 35 U.S.C. 154(b) by 0 days.

(21) Appl. No.: 10/343,508

(22) PCT Filed: Jul. 31, 2001

(86) PCT No.: PCT/FR01/02505
§ 371 (c)(1),
(2), (4) Date: Jul. 25, 2003

(87) PCT Pub. No.: WO02/11195
PCT Pub. Date: Feb. 7, 2002

(65) Prior Publication Data
US 2004/0092131 A1 May 13, 2004

(30) Foreign Application Priority Data
Aug. 1, 2000 (FR) .......................... 00 10149

(51) Int. Cl.⁷ ............................... H01L 21/26
(52) U.S. Cl. .................. 438/783; 438/786; 438/787
(58) Field of Search ............... 438/778, 783, 438/784, 786, 787, 788, 798

(56) References Cited

U.S. PATENT DOCUMENTS

| | | | |
|---|---|---|---|
| 5,028,967 A | * 7/1991 | Yamada et al. ............. | 359/355 |
| 5,122,483 A | 6/1992 | Sakai et al. ................. | 437/238 |
| 5,571,578 A | * 11/1996 | Kaji et al. ................... | 438/789 |
| 6,001,728 A | * 12/1999 | Bhan et al. ................. | 438/624 |
| 6,042,901 A | * 3/2000 | Denison et al. ............ | 427/579 |

FOREIGN PATENT DOCUMENTS

EP 0957017 11/1999

OTHER PUBLICATIONS

Lee and Hwangbo, "Inhomogeneous refractive indexof SiO/sub X/F/sub Y/ thin films prepared by ion beam assisted deposition," 11 $^{th}$ *International Conference on Surface Modifications of Metals by Ion Beams*, Beijing China, Sep. 19–24, 1999; *Surface and Coatings Technology*, 128–129:280–285, 2000.

Lee and Hwangbo, "Preparation of low refractive index SiO/sub optical thin films by ion beam assisted deposition," *Hankook Kwanghak Hoeji* (South Korea), 9(3):162–167, Jun. 1998, abstract.

* cited by examiner

*Primary Examiner*—T. N. Quach
(74) *Attorney, Agent, or Firm*—Fulbright & Jaworski L.L.P.

(57) ABSTRACT

The invention concerns a method comprising evaporating silicon and/or $SiO_x$, wherein said evaporating is further defined as occurring in the presenceof oxygen if silicon or $SiO_x$ with x less than two is being evaporated, to form a silicon oxide film at the surface of a substrate and in bombarding said silicon film, while it is being formed, with a beam of positive ions derived from both a polyfluorocarbon compound and a rare gas. The invention is useful for producing low-index antiglare films.

21 Claims, 2 Drawing Sheets

METHOD FOR DEPOSITING A FLUORINE-DOPED SILICA FILM

This application is a national phase application under 35 U.S.C. § 371 of PCT Application No. PCT/FR01/02505 filed Jul. 31, 2001, which claims priority to French Application No. 00/10149 filed Aug. 1, 2000, the contents of which are incorporated herein by reference in their entirety.

BACKGROUND OF THE INVENTION

1. Field of the Invention

The invention relates in a general manner to a process for depositing a fluorine-doped silica film ($SiO_xF_y$) on a surface of a substrate, in particular of an ophthalmic lens.

2. Description of Related Art

Silica-based ($SiO_2$) thin films are widely used in optics and more particularly in the field of ophthalmic optics. Such silica-based thin films are used in particular in anti-glare coatings. These anti-glare coatings are conventionally constituted of the multi-layered stacking of inorganic materials. These multi-layered anti-glare stackings usually comprise one or more layer(s) having a low refractive index in the visible spectral field. Conventionally, these layers of low refractive index are constituted of a silica-based thin film.

The deposition techniques for such silica-based thin films are very diverse, but deposition by evaporation under vacuum is one of the most commonly used techniques. These $SiO_2$-based thin films possess very satisfactory mechanical properties and refractive indices usually of the order of 1.48 for a wavelength around 630 nm.

However, in order to be able to improve the optical performances of the anti-glare stacking on the one hand and to generate novel systems of anti-glare stacking, it would be desirable to be able to lower the refractive index of this low index film while preserving its satisfactory mechanical properties.

In order to resolve this technical problem, it has already been proposed to generate porous silica ($SiO_2$) films, i.e. in which air is imprisoned.

Unfortunately, as well as the complex manufacturing techniques employed, the films thus obtained possess unsatisfactory mechanical properties which are inferior to those of a conventional silica thin film.

Moreover, the use of fluorine-doped silica thin films is known in other technical fields, in particular in the field of microelectronics.

The films are obtained by chemical deposition in the vapour phase assisted by plasma on discs for semiconductors.

This technique induces a heating of the substrate which is brought to high temperatures, incompatible with the treatment of ophthalmic organic glasses.

Furthermore, these layers pose stability problems. The patent application EP-0.957.017 gives an account of diffusion problems of fluorine to the outside of the fluorine-doped silica film which leads to adhesion problems.

The deposition of a silica film has been proposed in order to prevent this diffusion without, however, giving complete satisfaction.

The article "Characteristics of $SiO_xF_y$ Thin Films Prepared by Ion Beam Assisted Deposition" by F. J. Lee and C. K. Hwangbo describes thin films of fluorine-doped silicon oxide ($SiO_xF_y$). The article describes in particular the deposition of thin films of $SiO_xF_y$ of a thickness of about 600 nm on glass and silica substrates. The basic vacuum pressure is $1.2\times10^{-4}$ Pa and the temperature of the substrate is about 150° C. The silica is evaporated by means of an electron beam in the presence of oxygen in the chamber and the silicon oxide deposit is bombarded during its formation by a beam of polyfluorocarbonated ions formed by means of an ion gun starting from $CF_4$ gas.

The thin $SiO_xF_y$ films obtained have refractive indices varying from 1.394 to 1.462 and can be used as optical films.

However, the $SiO_xF_y$ films obtained by the process of the above article have the disadvantage of taking up water with time and of having an unstable refractive index which increases with time.

The object of the present invention is thus a process for the deposition on a surface of a substrate of a fluorine-doped silica film ($SiO_xF_y$) with a low refractive index, stable over time and having mechanical properties at least comparable to the films of the prior art.

SUMMARY OF THE INVENTION

According to the invention, the process for the deposition on a surface of a substrate of a fluorine-doped silica film ($SiO_xF_y$) comprises:

a) the evaporation of silicon and/or silicon oxide;

b) the deposition of silicon and/or silicon oxide evaporated at the surface of the substrate in order to form on the said substrate surface a silicon oxide film; and c) the bombardment, during its formation, of the silicon oxide film with a beam of positive ions derived from a polyfluorocarbonated compound or a mixture of polyfluorocarbonated compounds, the process being characterized in that the silicon oxide film is also bombarded, during its formation, by a beam of positive ions derived from a rare gas or a mixture of rare gases.

As indicated above, the deposit of silicon oxide during step b) of the process of the invention is obtained by evaporating silicon and/or a silicon oxide.

A silicon oxide of formula SiOx with x<2 or $SiO_2$ may be used. When SiOx with x<2 is used, it is necessary that the ambient medium contains oxygen $O_2$.

Of course, a $SiOx/SiO_2$ mixture may be used. $SiO_2$ silica is preferred in the framework of the invention.

The polyfluorocarbonated compound may be a linear, branched or cyclic perfluorocarbonated compound, and is preferably linear or cyclic.

Among the linear perfluorocarbonated compounds, mention may be made of $CF_4$, $C_2F_6$, $C_3F_8$ and $C_4F_{10}$; among the cyclic perfluorocarbonated compounds, mention may be made of $C_3F_6$ and $C_4F_8$; the preferred linear perfluorocarbonated compound is $CF_4$ and the preferred cyclic compound $C_4F_8$.

A mixture of perfluorocarbonated compounds may also be used.

The polyfluorocarbonated compound may also be a hydrogenofluorocarbon, preferably selected from $CHF_3$, $CH_2F_2$, $C_2F_4H_2$. The hydrogenofluorocarbon may also be linear, branched or cyclic.

Naturally, a mixture of perfluorocarbonated and hydrogenofluorocarbon compounds may be used.

The rare gas is preferably selected from xenon, krypton and their mixtures. The preferred rare gas is xenon.

During the deposition of the fluorine-doped silica layer, the substrate is usually at temperature lower than 150° C., preferably lower than or equal to 120° C. and better still varies from 30° C. to 100° C.

In a preferred embodiment of the invention, the temperature of the substrate varies from 50 to 90° C.

The fact that the deposit according to the invention can be performed at a relatively low temperature makes it possible to form thin films on a large variety of substrates and in particular substrates made of organic glass, such as ophthalmic lenses made of organic glass.

Usually, the process of the invention is carried out in a vacuum chamber at a pressure of $10^{-2}$ to $10^{-3}$ Pa. If necessary, oxygen gas can be introduced into the vacuum chamber during the deposition of the film.

The fluorine-doped silicon oxide films of the invention usually have a thickness of 10 to 500 nm, preferably from 80 to 200 nm, and the atomic fluorine content of the films is usually from 6 to 10%.

The silicone content is usually of the order of 30% atomic.

The fluorine-doped silicon oxide films obtained by the process of the invention have a refractive index $n \leq 1.48$, and preferably from 1.42 to 1.45 (for radiation of wavelength $\lambda=632.8$ nm at 25° C.).

DESCRIPTION OF THE DRAWINGS

The remainder of the description refers to the appended figures which represent respectively.

DETAILED DESCRIPTION OF THE INVENTION

Figure 1:
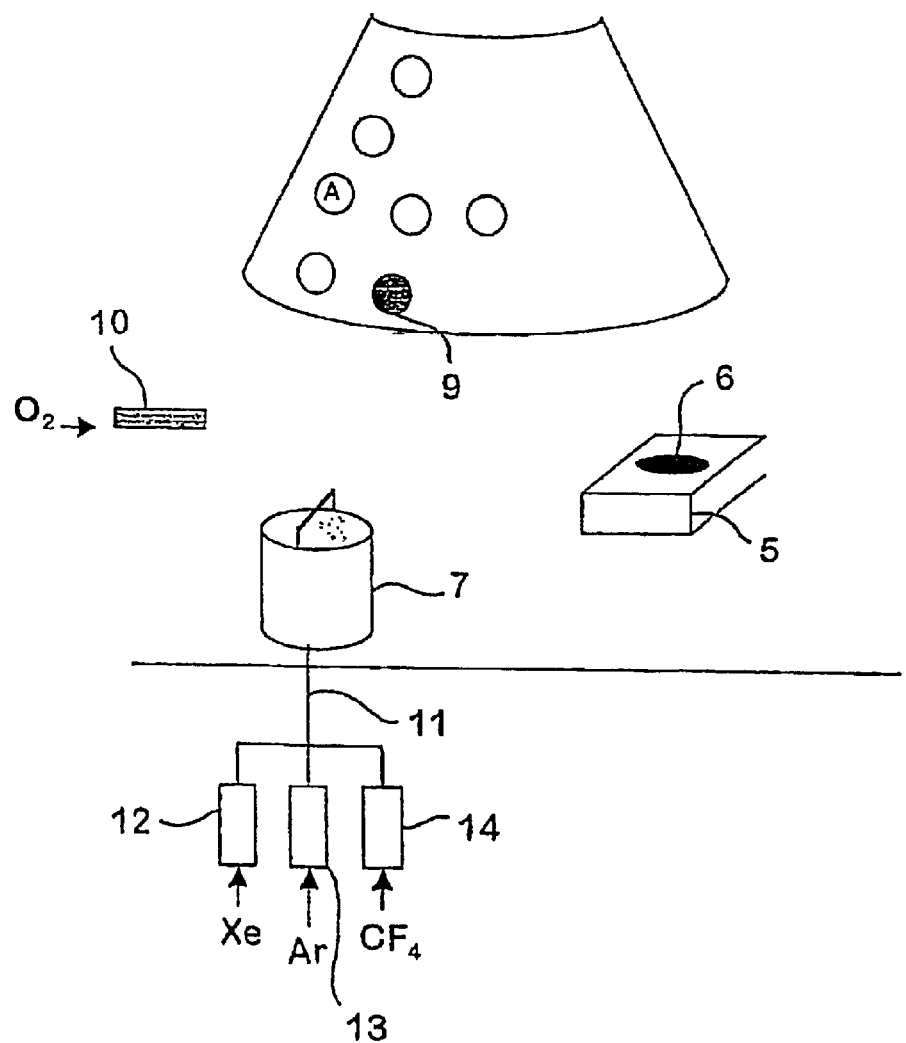
FIG. 1, a schematic view of an appliance for carrying out the process of the invention.
Figure 2:
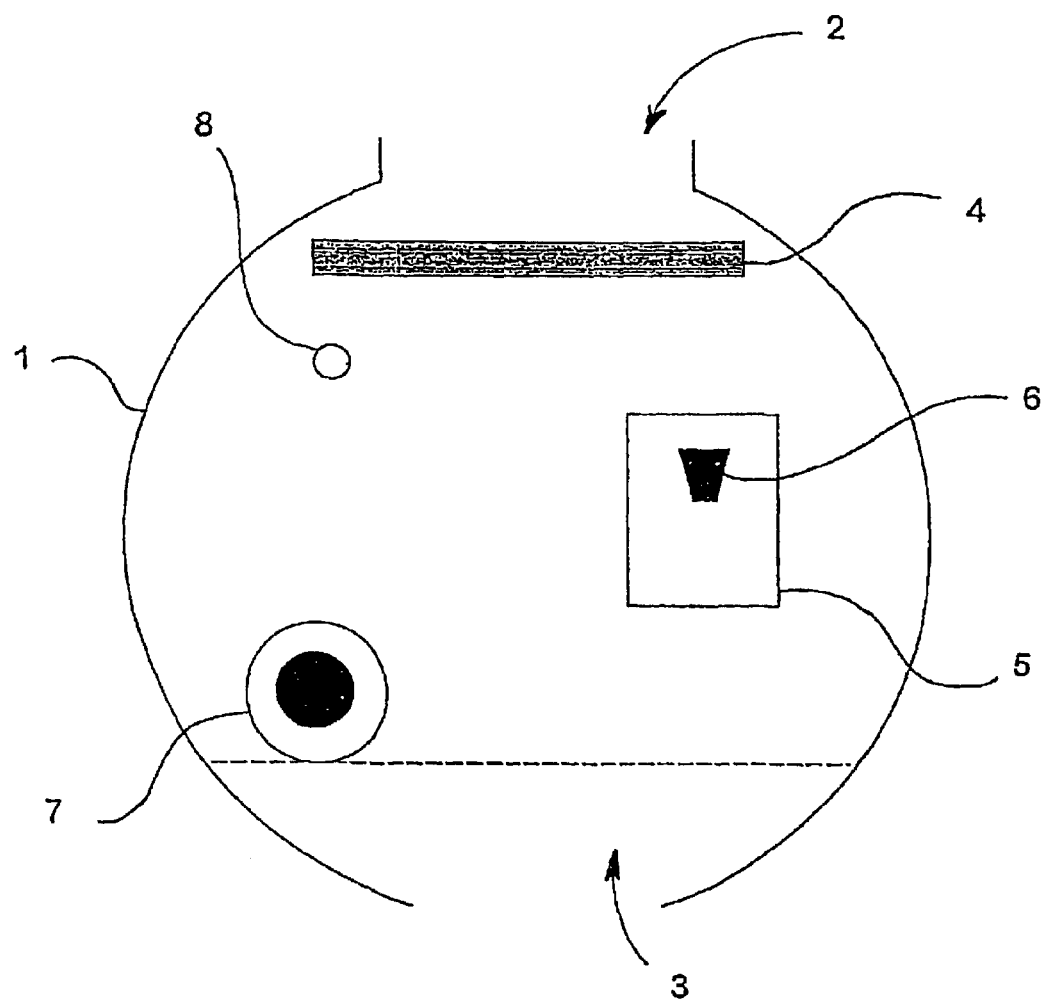
FIG. 2, a schematic plan view of the appliance of FIG. 1.

The device for depositing thin films shown in the FIGS. 1 and 2 assisted by an ion beam is a standard device. This device comprises a vacuum chamber, the first extremity 2 of which is connected to one or more vacuum pumps and the other opposite extremity comprises a door 3. A cold trap 4 can be placed in the chamber close to the extremity 2 connected to the vacuum pumps. Within chamber 1 is located an electron gun 5 comprising a crucible 6 designed to contain the silica to be vaporised. The substrates A to be coated are arranged on a support close to a quartz micro-balance 9. If need be, provision may also be made for an oxygen gas supply to chamber 10. The pressure in the chamber can be measured by means of a hot cathode pressure gauge 8. The supply line 11 of the ion gun 7 is connected to three feed drive devices for gases making it possible to simultaneously or independently supply the ion gun with gases of the desired nature and/or flow rates.

In the present case, the vacuum chamber is a Leybold Heraeus chamber capable of attaining a basic vacuum of $5 \times 10^{-5}$ Pa, the ion gun is MARK II Commonwealth gun, and the electron gun is a Leybold ESV gun.

For the control feed device of gases of the ion gun, a BROOKS mass flow control device is used for argon gas, itself controlled by the MARK II control device. For the feed of xenon and the polyfluorocarbonated compound, mass flow control devices are used such as the multigas control device MKS 647 B in which the nature and flow rate of the gases can be programmed.

The deposition on the substrates of the fluorine-doped silica film according to the invention can be carried out in the following manner:

The chamber 1 is placed under a vacuum of $2 \times 10^{-3}$ Pa (measured by means of the hot cathode pressure gauge 8). The ion gun 7 is primed with argon gas, then $CF_4$ gas and xenon are introduced at selected flow rates and the argon flux is interrupted. The silica particles ($SiO_2$) placed in the crucible 6 are preheated by the electron beam gun. When oxygen gas is used, it is introduced in the chamber at a fixed flow rate. Simultaneously, the electron beam gun and the ion gun are equipped with an obturator, and the two obturators of the electron beam gun and the ion gun are opened simultaneously. The thickness of the deposit is regulated by the quartz micro-balance 9 near to the sample substrates. When the desired thickness of the films is obtained, the two obturators are closed, the electron beam and ion guns are cut, the supply of the various gases is stopped, and the vacuum of the chamber is broken. The sample substrates coated with the fluorine-doped silica film according to the invention are then recovered.

The following examples illustrate the present invention.

EXAMPLES

By operating as previously described, flat surface silicon samples have been coated with fluorine-doped silica films. The refractive index at the wavelength $\lambda=632.8$ nm and at 25° C. of the fluorine-doped silica films formed was measured at different times after the formation of the films. The absorption of water by the films formed at different times after the preparation of the films was also determined by infrared spectrometry, this absorption being characteristic change of the film with time. The conditions for depositing the fluorine-doped silica films are indicated in Table I, while the properties of the films obtained, in particular the refractive index and the detection of the presence of water by infrared spectrometry and the thickness of the layers obtained, are indicate in Table II.

TABLE I

| | Deposition conditions | | | | | | | | |
|---|---|---|---|---|---|---|---|---|---|
| Example N° | Deposition rate (nm/s) | Ion gun anode current (A) | Ion gun anode voltage (V) | Polyfluoro-carbonated compound | Polyfluoro-carbonated compound flow rate (cm³/minute) | Xe flow rate (cm³/minute) | $O_2$ flow rate (cm³/minute) | Chamber pressure (Pa)[1] | Substrate temperature (° C.) |
| Comparative C1 | 0.51 | 0.53 | 160 | $CF_4$ | 2.3 | — | — | $4.10^{-3}$ | 70° C.[2] |
| Comparative C2 | 0.18 | 0.3 | 100 | $CF_4$ | 1.8 | — | — | $5.3.10^{-3}$ | 180° C.[3] |
| 1 | 0.75 | 4 | 150 | $CF_4$ | 2.5 | 2.9 | 4 | $1.8.10^{-2}$ | 70° C.[2] |
| 2 | 0.75 | 0.5 | 100 | $CF_4$ | 1.5 | 0.5 | 4 | $7.9.10^{-3}$ | 70° C.[2] |
| 3 | 0.5 | 4 | 150 | $C_4F_8$ | 1 | 2.7 | 15 | $2.4.10^{-2}$ | 70° C.[2] |

TABLE I-continued

Deposition conditions

| Example N° | Deposition rate (nm/s) | Ion gun anode current (A) | Ion gun anode voltage (V) | Polyfluoro-carbonated compound | Polyfluoro-carbonated compound flow rate (cm³/minute) | Xe flow rate (cm³/minute) | O₂ flow rate (cm³/minute) | Chamber pressure (Pa)[(1)] | Substrate temperature (° C.) |
|---|---|---|---|---|---|---|---|---|---|

[(1)]Measured during deposition
[(2)]Temperature obtained by heating the substrate by means of the ion gun
[(3)]Temperature maintained throughout deposition by a heating device.

TABLE II

Properties of the SiOxFy films

| | | Refractive index at λ = 632.8 nm | | | | | Presence of water (IR) | | |
|---|---|---|---|---|---|---|---|---|---|
| Example N° | Thickness (nm) | After 1 hour | After 24 hours | After 2 days | After 2 weeks | After 2 months | After 1 hour | After 2 days | After 2 weeks |
| Comparative C1 | 125 | 1,415 | — | 1,465 | — | — | No | Yes | — |
| Comparative C2 | 110 | 1,400 | 1,448 | — | — | — | — | — | — |
| 1 | 190 | 1,429 | — | — | 1,432 | 1,435 | No | No | No |
| 2 | 180 | 1,444 | — | — | 1,449 | 1,450 | No | No | No |
| 3 | 190 | 1,434 | — | — | 1,437 | — | No | No | No |

The results of Table II show that the bombardment with an ion beam derived simultaneously from a polyfluorocarbonated compound and a rare gas, in this case xenon, makes it possible to obtain a particularly noteworthy stabilization of the refractive index with time. In fact, the refractive index of the films of the comparative examples C1, C2 increased by 3.5% after two days and by 3.4% after 24 hours, respectively, whereas the refractive index of the films of the examples 1 to 3 obtained by the process of the invention show only an increase of less than 0.35% after two weeks, and less than 0.42% after 2 months.

What is claimed is:

1. A process for depositing on a surface of a substrate a fluorine-doped silica film (SiOxFy) comprising:
    evaporating silicon and/or $SiO_x$, wherein said evaporating is further defined as occurring in the presence of oxygen if silicon or $SiO_x$ with x less than two is being evaporated;
    depositing the evaporated silicon and/or $SiO_x$ onto a surface of a substrate in order to form a silicon oxide film on the substrate;
    bombarding the silicon oxide film, during formation, with a beam of positive ions derived from a polyfluorocarbonated compound or of a mixture of polyfluorocarbonated compounds; and
    bombarding the silicon oxide film, during formation, by a beam of positive ions derived from a rare gas or a mixture of rare gases.

2. The process of claim 1, wherein the polyfluorocarbonated compound is a linear or cyclic perfluorocarbonated compound.

3. The process of claim 2, wherein the linear perfluorocarbonated compound is $CF_4$, $C_2F_6$, or $C_3F_8$ and the cyclic perfluorocarbonated compounds is $C_3F_6$ or $C_4F_8$.

4. The process of claim 3, wherein the cyclic perfluorocarbonated compound is $C_4F_8$.

5. The process of claim 1, wherein the polyfluorocarbonated compound is a hydrogenofluorocarbon.

6. The process of claim 5, wherein the hydrogenofluorocarbon is $CHF_3$, $CH_2F_2$, or $C_2F_4H_2$.

7. The process of claim 1, wherein the rare gas is xenon or krypton.

8. The process of claim 7, wherein the rare gas is xenon.

9. The process of claim 1, wherein during the depositing of the silicon oxide and the bombarding, the substrate is at a temperature lower than 150° C.

10. The process of claim 9, wherein the substrate is at temperature lower than 120° C.

11. The process of claim 9, wherein the substrate is at a temperature between 30° C. and 100° C.

12. The process of claim 9, wherein the substrate is at a temperature between 50° C. and 90° C.

13. The process of claim 1, further defined as carried out in a vacuum chamber at a pressure of $10^{-2}$ to $10^{-3}$ Pa.

14. The process of claim 1, further defined as carried out in a chamber into which oxygen gas is introduced during the deposition of the evaporated silicon and/or silicon oxide into the surface of the substrate.

15. The process of claim 1, wherein the fluorine-doped silicon oxide film formed has a thickness of 10 to 500 nm.

16. The process of claim 15, wherein the fluorine-doped silicon oxide film formed has a thickness of 80 to 200 nm.

17. The process of claim 1, wherein the atomic fluorine content of the fluorine-doped silicon oxide film is from 6% to 10%.

18. The process of claim 1, wherein the silicon oxide film has a refractive index, n, of less than 1.48 at a wavelength of 632.8 and at 25° C.

19. The process of claim 18, wherein the refractive index, n, is from 1.42 to 1.45 at a wavelength of 632.8 nm and at 25° C.

20. The process of claim 1, wherein the substrate is as an ophthalmic lens.

21. The process of claim 1, wherein the substrate is as a flat silicon sample.

* * * * *

UNITED STATES PATENT AND TRADEMARK OFFICE
CERTIFICATE OF CORRECTION

PATENT NO.    : 6,797,649 B2
DATED         : September 28, 2004
INVENTOR(S)   : Scherer et al.

It is certified that error appears in the above-identified patent and that said Letters Patent is hereby corrected as shown below:

Title page,
Item [57], ABSTRACT,
Line 3, please delete "presenceof" and insert -- presence of --.

Column 5,
Line 55, delete "by" and insert -- with --.

Signed and Sealed this

Nineteenth Day of April, 2005

JON W. DUDAS
*Director of the United States Patent and Trademark Office*